(12) United States Patent
Takeuchi et al.

(10) Patent No.: US 7,646,020 B2
(45) Date of Patent: Jan. 12, 2010

(54) APPARATUS FOR OBSERVING AN ASSEMBLED STATE OF COMPONENTS AND METHOD OF OBSERVING AN ASSEMBLED STATE OF COMPONENTS USING SUCH APPARATUS

(75) Inventors: Shuichi Takeuchi, Kawasaki (JP); Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 209 days.

(21) Appl. No.: 11/849,069

(22) Filed: Aug. 31, 2007

(65) Prior Publication Data

US 2008/0129303 A1    Jun. 5, 2008

(30) Foreign Application Priority Data

Nov. 30, 2006    (JP)    ............................. 2006-324182

(51) Int. Cl.
*H01L 29/04*   (2006.01)
*H01L 31/20*   (2006.01)
*H01L 31/036*  (2006.01)
*H01L 23/52*   (2006.01)
*H01L 23/48*   (2006.01)
*H01L 29/40*   (2006.01)
*H01L 21/66*   (2006.01)
*H01L 21/50*   (2006.01)
*H01L 21/48*   (2006.01)

(52) U.S. Cl. .................. 257/59; 257/783; 257/E33.001
(58) Field of Classification Search .................. 257/59, 257/783, E33.001; 438/15, 118
See application file for complete search history.

(56) References Cited

U.S. PATENT DOCUMENTS

| | | | | |
|---|---|---|---|---|
| 5,945,834 | A * | 8/1999 | Nakata et al. | ................ 324/754 |
| 7,091,733 | B2 | 8/2006 | Takekoshi et al. | |
| 7,242,206 | B2 | 7/2007 | Takekoshi et al. | |
| 2004/0183561 | A1 | 9/2004 | Takekoshi et al. | |
| 2005/0205641 | A1* | 9/2005 | Takeuchi et al. | ............. 228/1.1 |
| 2005/0253575 | A1 | 11/2005 | Takekoshi et al. | |

FOREIGN PATENT DOCUMENTS

| | | |
|---|---|---|
| EP | 1 455 388 | 9/2004 |
| JP | 2000-200796 | 7/2000 |
| JP | 2002-343829 | 11/2002 |
| JP | 2003-168709 | 6/2003 |
| JP | 1 696 479 | 8/2006 |

* cited by examiner

*Primary Examiner*—Luan C Thai
(74) *Attorney, Agent, or Firm*—Staas & Halsey

(57) ABSTRACT

When bonding a workpiece to a substrate, processed parts of the substrate and the workpiece are observed and behavior such as the production of voids and the flowing of resin is observed. An apparatus for observing an assembled state of components includes: a stage on which a substrate is set; a head mechanism that bonds, by applying heat and pressure, an observation workpiece made of a transparent material to the substrate via resin supplied between the substrate and the observation workpiece; a light source that irradiates an observed part of the substrate and the observation workpiece mounted on the stage with light; and a camera that takes, from the observation workpiece side, an image of the observed part when the observation workpiece is bonded to the substrate set on the stage.

7 Claims, 2 Drawing Sheets

APPARATUS FOR OBSERVING AN ASSEMBLED STATE OF COMPONENTS AND METHOD OF OBSERVING AN ASSEMBLED STATE OF COMPONENTS USING SUCH APPARATUS

BACKGROUND OF THE INVENTION

1. Field of the Invention

The present invention relates to an apparatus for observing an assembled state of components, such as when a semiconductor chip is mounted on a substrate, and to a method of observing the assembled state of components using such apparatus. In more detail, the invention relates to an apparatus for observing an assembled state of components that can observe conditions such as whether voids (bubbles) have been produced in resin when resin is provided between a substrate and a workpiece and heat and pressure are applied to join the workpiece to the substrate via the resin, and to a method of observing an assembled state of components using such apparatus.

2. Related Art

One method of flip-chip bonding a semiconductor chip to a substrate supplies resin to a chip mounting position on the substrate and bonds the semiconductor chip to the substrate by applying heat and pressure to the semiconductor chip. With this bonding method, when the semiconductor chip has been mounted on the substrate, voids (bubbles) are sometimes produced in the resin (i.e., "underfill resin") that fills the space between the substrate and the semiconductor chip. Products where voids are present in the underfill resin suffer from the problems of less reliable bonding between the substrate and the semiconductor chip at positions where voids are formed and of migration occurring at the voids, resulting in wires becoming short-circuited. Accordingly, there is demand for a method of bonding a substrate and a semiconductor chip that does not leave voids in the underfill resin.

To prevent voids from occurring, it is necessary to identify what is causing the voids. However, to identify what causes voids to be produced in resin, current methods involve only dismantling products, checking for the presence of voids, and then trying to work out how and why the voids occur.

On the other hand, in the field of resin sealing apparatuses used for semiconductor devices, a method of controlling a resin sealing apparatus used for semiconductor devices has been proposed (see Patent Document 1, for example). This method observes the behavior of resin when filling a cavity and feeds back the results of such observations so that improved control can be carried out over the filling apparatus used to fill the cavity with resin.

Patent Document 1

Japanese Laid-Open Patent Publication No. 2000-200796

SUMMARY OF THE INVENTION

Patent Document 1 discloses a method of observing the behavior of resin that fills a cavity for a resin sealing apparatus used to seal a lead frame. More specifically, a construction is used where an observation window for observing the inside of the cavity is provided in part of a mold so that the behavior of the resin that fills the cavity can be observed.

However, when mounting a semiconductor chip on a substrate by flip-chip bonding, if the semiconductor chip is supported by a head mechanism so as to be covered by the head mechanism from above and the semiconductor chip is mounted by applying heat and pressure thereto, the processed parts of the substrate and the semiconductor chip will be hidden by the head mechanism, resulting in the problem of it not being possible to check how the underfill resin behaves when the chip is bonded.

For this reason, it is an object of the present invention to provide an apparatus for observing the assembled state of components that can observe the processed parts of a substrate and a workpiece when bonding the workpiece to the substrate using resin supplied between the substrate and the workpiece and therefore can grasp the behavior of the resin, such as how voids are caused and how the resin flows, and also to provide a method of observing the assembled state of components using such apparatus.

By using a construction where images of the observed part can be reliably taken even when the processed parts of the substrate and the workpiece are hidden by the head that applies heat and pressure to the substrate and the workpiece, the present inventors realized the present invention.

That is, an apparatus for observing an assembled state of components according to the present invention includes: a stage on which a substrate is set; a head mechanism that bonds, by applying heat and pressure, an observation workpiece made of a transparent material to the substrate via resin supplied between the substrate and the observation workpiece; a light source that irradiates an observed part of the substrate and the observation workpiece mounted on the stage with light; and camera that takes, from the observation workpiece side, an image of the observed part when the observation workpiece is bonded to the substrate set on the stage.

Another apparatus for observing an assembled state of components according to the present invention includes: a stage on which a substrate made of a transparent material is set; a head mechanism that bonds, by applying heat and pressure, an observation workpiece to the substrate via resin supplied between the substrate and the observation workpiece; a light source that irradiates an observed part of the substrate and the observation workpiece set on the stage with light; and camera that takes, from the substrate side, an image of the observed part when the observation workpiece is bonded to the substrate set on the stage.

Yet another apparatus for observing an assembled state of components according to the present invention includes: a stage on which a substrate made of a transparent material is set; a head mechanism that bonds, by applying heat and pressure, an observation workpiece made of a transparent material to the substrate via resin supplied between the substrate and the observation workpiece; a light source that irradiates an observed part of the substrate and the observation workpiece set on the stage with light; and camera that takes, from the substrate side and the observation workpiece side, images of the observed part when the observation workpiece is bonded to the substrate set on the stage.

The head mechanism may be provided with a head part that applies pressure to the observation workpiece and an imaging window for taking an image of the observed part may be provided in the head part on an optical axis of the camera.

An imaging window for taking an image of the observed part may also or alternatively be provided in the stage on an optical axis of the camera.

By doing so, it is possible to reliably take images of the observed part of the substrate and the workpiece without the head mechanism getting in the way.

Also, the head mechanism may be provided with a head part that applies pressure to the observation workpiece and the camera may be incorporated in the head part.

The camera may also or alternatively be incorporated in the stage.

By doing so, it is possible to eliminate the space occupied by the camera and therefore it is possible to provide a compact apparatus for observing an assembled state of components.

Another aspect of the present invention is a method of observing an assembled state of components for observing a bonded state when bonding an observation workpiece to a substrate using resin, at least one of the substrate and the observation workpiece being transparent, the method including: a step of setting a substrate on a stage; a step of irradiating, when the observation workpiece has been supplied onto the substrate using a head mechanism and heat and pressure are applied to resin supplied between the substrate and the observation workpiece using the head mechanism, a part of the substrate and the observation workpiece to which the heat and pressure are applied with light from a light source; and a step of taking an image of at least part of the part to which the heat and pressure are applied using a camera while the part is being illuminated.

By using the apparatus for observing an assembled state of components according to the present invention, it is possible to reliably take images of the processed parts of the substrate and the workpiece. By doing so, it is possible to know about the production of voids in the resin supplied between the substrate and the workpiece and how the resin flows.

Also, by using a construction equipped with a storage unit that stores the image data taken by the camera, it is possible to input the taken images into an external personal computer and to analyze the observed part in more detail after the taking of images has been completed.

Also, by using a construction that is further equipped with an image processor that carries out image processing on the taken image data, it is possible to process the taken image data within the apparatus for observing the assembled state of components without using an external personal computer. Accordingly, it is possible to immediately display images that visualize the state of voids on a display provided in the apparatus for observing the assembled state of components.

It is also possible to use a construction where processed product defective/non-defective determination data for determining whether a bonded/processed product is defective or non-defective based on the respective bonded states of the substrate, the resin, and the workpiece (i.e., data relating to voids) is stored in advance in a storage unit and where a data comparator for comparing the data processed by the image processor and an alarm for issuing a warning to the operator based on the result of comparing the data are further provided. By doing so, it is possible to immediately warn the operator, for example, when a defective product has been produced.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

First Embodiment

Preferred embodiments of an apparatus for observing an assembled state of components will now be described with reference to the attached drawings.

Figure 1:
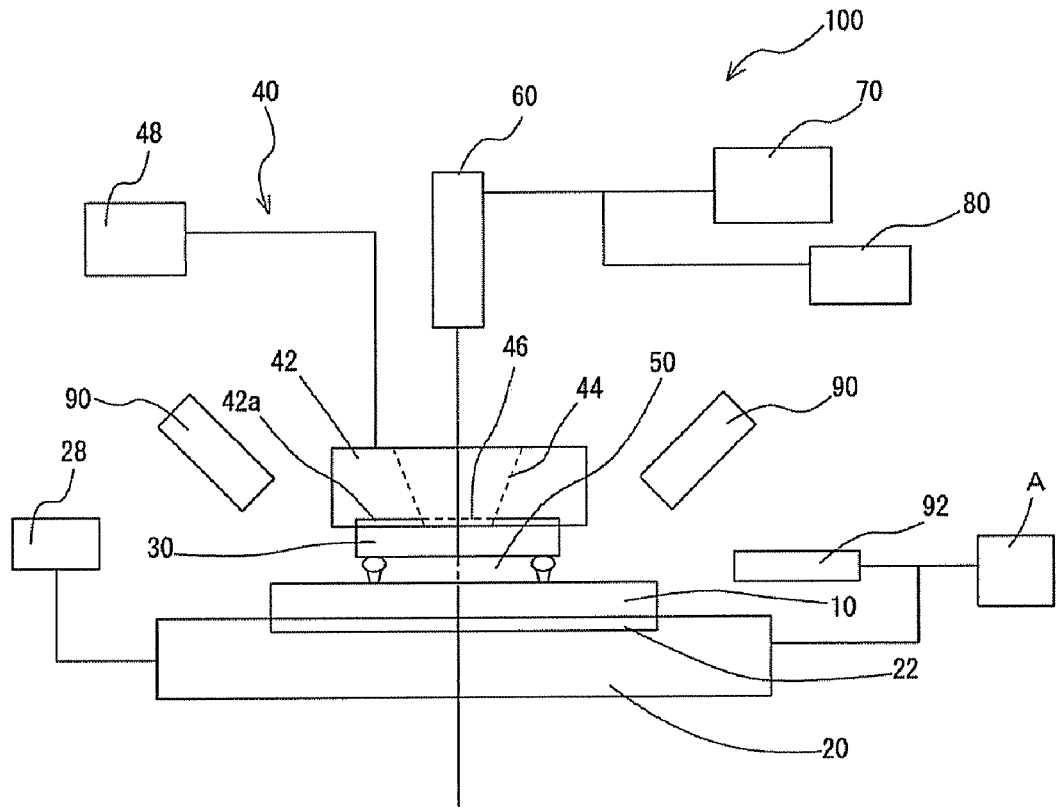
FIG. 1 is a schematic diagram showing the construction of an apparatus for observing an assembled state of components according to a first embodiment.

FIG. 1 is a schematic diagram showing the construction of an apparatus for observing an assembled state of components according to a first embodiment of the present invention.

The observing apparatus 100 for observing an assembled state of components according to the present embodiment includes a stage 20 on which a substrate 10 is set, a head mechanism 40 for supporting an observation workpiece 30 and bonding the observation workpiece 30 to the substrate 10, a camera 60 that takes images of the bonded state of the substrate 10 on the stage 20 and the observation workpiece 30, a display apparatus 70 that outputs the images taken by the camera 60, and a storage unit 80 that stores image data taken by the camera 60.

Note that in the present embodiment, resin 50 is supplied in advance onto the substrate 10 and in this state an operation is carried out where the head mechanism 40 applies heat and pressure to the observation workpiece 30 supported by the head mechanism 40 to bond the observation workpiece 30 to the substrate 10. This corresponds to an operation that mounts a semiconductor chip (equivalent to the observation workpiece 30) to the substrate 10 by flip-chip bonding.

The substrate 10 used in the present embodiment is a normal resin substrate. Connection pads and/or wires (not shown) are formed on the surface of the substrate 10 to electrically connect a workpiece, such as a semiconductor chip.

Suction holes for attaching the substrate 10 by suction are formed in the stage 20. The suction holes are connected to an air apparatus A provided in the periphery of the stage 20. A heater 22 for heating the substrate 10 is provided at a position on the upper surface of the stage 20 where the substrate 10 is set. The heater 22 is set so that on/off control over the power supplied to the heater 22 and control over the temperature of the heater 22 can be carried out by a heater operation unit 28. The heater operation unit 28 can be realized by a personal computer provided separately.

The observation workpiece 30 used in the present embodiment (hereinafter, sometimes referred to simply as the "workpiece 30") is a workpiece used for observation purposes only and is formed of a transparent material such as glass with the same form as a semiconductor chip. The workpiece 30 used in the present embodiment is made of a different material to that used in an actual product. This means that although strictly speaking some differences are expected between the behavior of the resin 50 between the substrate 10 and the observation workpiece 30 in the present embodiment and the behavior of resin 50 between the substrate 10 and a real workpiece 30 in an actual product, it is still possible to sufficiently know the qualitative behavior of the resin 50 supplied between the substrate 10 and a workpiece 30.

A pressing head 42 that supports the observation workpiece 30 is disposed above the stage 20. The pressing head 42 is provided so as to be capable of being moved closer to and away from the stage 20 by a head operation unit 48. A heater 42a for heating the observation workpiece 30 is disposed on the pressing head 42 at a part that supports the observation workpiece 30. Also, an imaging hole 44 that makes it possible for the camera 60, described later, to take an image of the processed state of the substrate 10 and the workpiece 30 is formed so as to pass through from the upper end surface of the pressing head 42 to the lower end surface of the pressing head 42. The imaging hole 44 is formed in a truncated cone shape so as to become gradually narrower toward the lower end surface of the pressing head 42. An imaging window 46 that is formed of a transparent, heat-resistant material such as heat-resistant glass is provided on the substrate-side surface of the imaging hole 44.

In FIG. 1, the imaging hole 44 and the imaging window 46 are shown larger than their actual sizes for ease of understanding the present invention. The actual imaging hole 44 and the imaging window 46 are formed with sizes and positions that do not interfere with the application of heat and pressure to the substrate 10, the workpiece 30, and the resin 50 by the pressing head 42.

The head operation unit 48 supports the workpiece 30 on the pressing head 42 and carries out an operation that aligns the workpiece 30 with a predetermined position on the substrate 10 and bonds the workpiece 30 to the substrate 10 by pressing the workpiece 30.

The camera 60 is arranged further above the pressing head 42 that is itself disposed above the stage 20. A digital camera can be favorably used as the camera 60. The optical axis of the camera 60 is disposed so as to coincide with the center axis of the imaging hole 44 formed in the pressing head 42. The camera 60 has an optical zoom function and resolution that make it possible to take images of the behavior of the resin 50 at the bonded part of the substrate 10 and the workpiece 30 via the imaging hole 44. The images taken by the camera 60 are displayed on the display apparatus 70 which is a monitor or the like. The image data taken by the camera 60 is also stored in the storage unit 80, which can be a nonvolatile memory that is fixed or is portable.

The observed part for which the camera 60 takes images is illuminated with light by one or more light sources 90. As shown in FIG. 1, a plurality of light sources 90 are disposed diagonally above the stage 20. The respective light sources 90 are disposed so as to illuminate the observed part with light. The light sources 90 are disposed so that the angles thereof can be adjusted to adjust the position illuminated with light.

For example, the light sources 90 may be disposed at a position above the imaging hole 44 and some distance away from the optical axis of the camera 60. If the light sources 90 are disposed above the imaging hole 44 in this way, light from the light sources 90 will be incident on the surface of the imaging hole 44 that is formed in the shape of a truncated cone, the light will be reflected by the surface of the imaging hole, and the light will become incident on the observed position from the imaging window 46.

In this way, in the present embodiment, images showing the behavior of the resin 50 can be taken from the workpiece 30 side (i.e., from above the stage 20).

An air blowing device 92 that horizontally supplies blown air is disposed at a position whose height matches the upper end surface of the workpiece 30. The air blowing device 92 is connected to the air apparatus A. This air blowing device 92 can eradicate heat haze between the observed part and the camera 60 and therefore makes it possible to take clear images showing the behavior of the resin at the observed part.

The observing apparatus 100 for observing an assembled state of components according to the present embodiment is constructed as described above. Next, a method of observing the assembled state of components using the observing apparatus 100 for observing an assembled state of components according to the present embodiment will be described.

First, the substrate 10 is set on the stage 20 and the substrate 10 is heated by the heater 22 of the stage 20. Next, the resin 50 is supplied to the substrate 10, the pressing head 42 holds and supports a semiconductor chip as the workpiece 30 by suction, the workpiece 30 is positioned at a predetermined position on the substrate 10, and the workpiece 30 is pressed and heated. The resin 50 is hardened by a process that applies heat and pressure using the pressing head 42 and the stage 20 to bond the semiconductor chip to the substrate 10.

The camera 60 starts taking images of the observed part starting from when the semiconductor chip is transported to and positioned on the substrate 10 and light is irradiated onto the observed part from the light sources 90. Images are taken until the bonding of the semiconductor chip is completed. During image is taking, the air blowing device 92 supplies horizontally blown air onto the upper surface of the observed part.

The images taken by the camera 60 are outputted to a monitor as the display apparatus 70 and are stored as data in the storage unit 80. The user can observe the taken images displayed on the monitor while the assembly process is being carried out on the components.

By using the camera 60 to observe the resin 50 starting from the positioning of the semiconductor chip on the substrate 10 until bonding is completed, it is possible to grasp whether voids have been produced inside the resin 50 and how the resin 50 is flowing.

Second Embodiment

Figure 2:
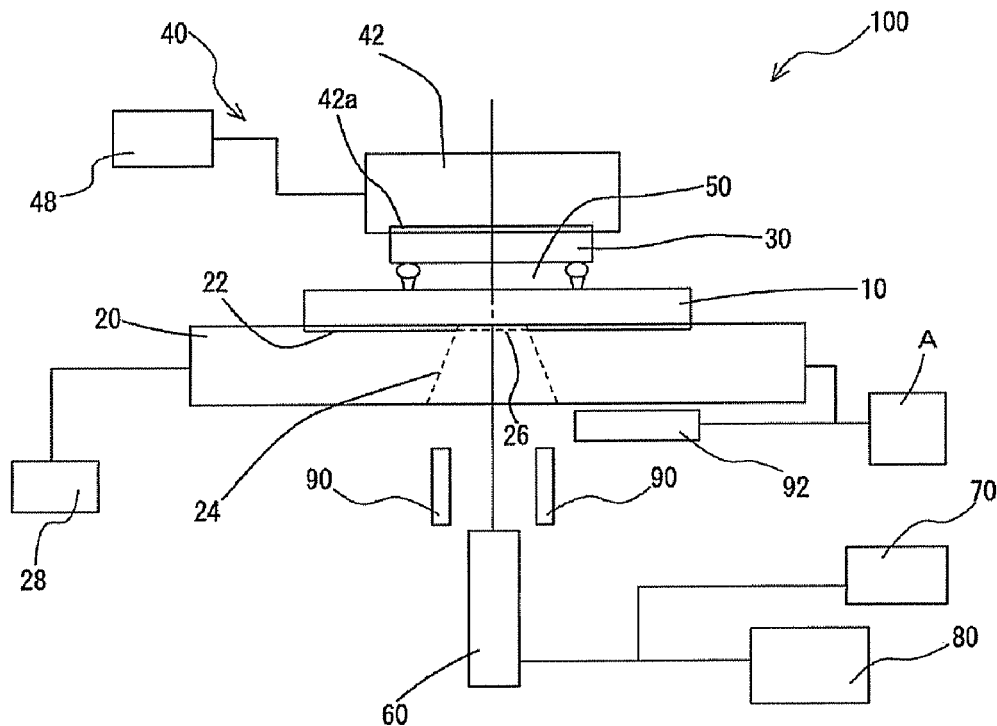
FIG. 2 is a schematic diagram showing the construction of an apparatus for observing an assembled state of components according to a second embodiment.
Figure 3:
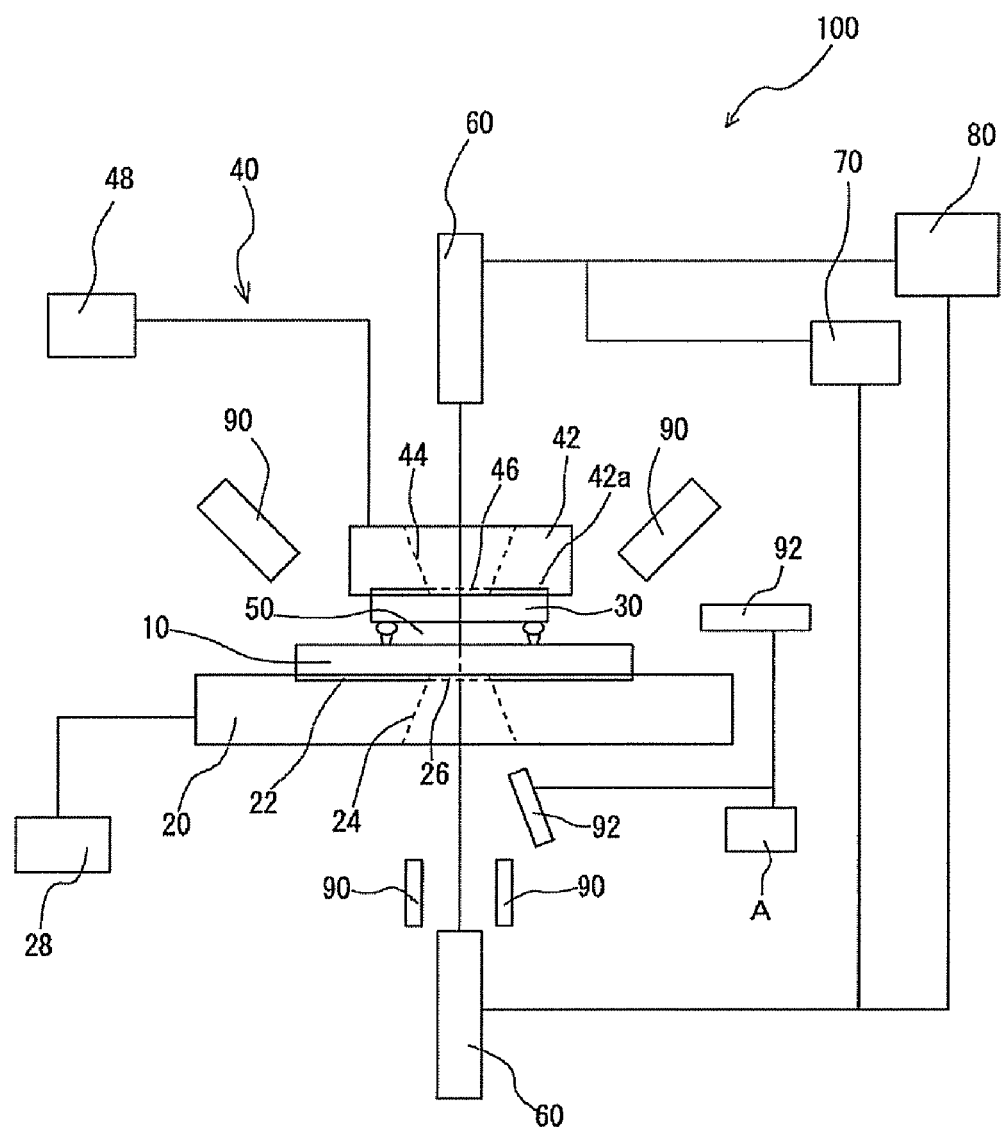
FIG. 3 is a schematic diagram showing the construction of an apparatus for observing an assembled state of components according to a third embodiment.

FIG. 2 is a schematic diagram showing the construction of an apparatus 100 for observing an assembled state of components according to a second embodiment of the present invention. The construction of the observing apparatus 100 for observing an assembled state of components according to the second embodiment is fundamentally the same as that of the first embodiment described earlier.

In the second embodiment, the substrate 10 is formed of a transparent material such as glass and the observing apparatus 100 is constructed so as to take images of the observed part from the substrate 10 side. By using this construction, it is possible to use the same workpiece (i.e., a semiconductor chip) as that actually mounted on a substrate 10 as the observation workpiece 30.

In the present embodiment, there is no need to form the imaging hole 44 that is formed in the pressing head 42 in the first embodiment. The camera 60 takes images of the observed part of the substrate 10 and the observation workpiece 30 from below the substrate 10. Accordingly, the camera 60 is disposed below the stage 20. For this reason, an imaging hole 24 that makes it possible to take images of the processing state of the substrate 10 and the workpiece 30 is formed in the stage 20. The imaging hole 24 passes through the stage 20 in the vertical direction and is formed in the shape of a truncated cone so that the diameter gradually decreases from the lower end surface of the stage 20 toward the upper end surface of the stage 20. An imaging window 26 that is formed of a transparent, heat-resistant material such as heat-resistant glass is provided on the upper end surface of the imaging hole 24.

One or more light sources 90 is disposed below the imaging hole 24 formed in the stage 20. It is possible to use either a construction where the light sources 90 illuminate the observed part with direct light or as shown in FIG. 2 a construction where light is irradiated onto the inner surface of the imaging hole 24 so that the light is reflected by the inner surface of the imaging hole 24 to become incident on the observed part from the imaging window 26. The air blowing device 92 is disposed between the camera 60 and the stage 20.

As shown in FIG. 2, the air blowing device 92 may be disposed so as to blow air from diagonally below the stage 20 toward the inside of the imaging hole 24.

Third Embodiment

The present embodiment is a combination of the first embodiment and the second embodiment. That is, both the substrate 10 and the workpiece 30 are formed from a transparent material such as glass and images of the observed part are taken simultaneously from both the substrate side and the observation workpiece side (i.e., from both below and above) by a camera 60 disposed above the workpiece 30 (the stage 20) and a camera 60 disposed below the stage 20.

Since the construction of the present embodiment is simply a combination of the first embodiment and the second embodiment, detailed description thereof is omitted.

Fourth Embodiment

The present embodiment is characterized by using an infrared camera as the camera 60. By using this construction, it is possible to form the substrate 10 and the observation workpiece 30 of the same materials as actual components, and therefore it is possible to know the behavior of the resin 50 in a state that is closer to the actual state. Also, it becomes no longer necessary to form the imaging holes 44, 24 in the pressing head 42 and the stage 20 in truncated cone shapes, and the holes can be formed as simple through holes. It is also possible to omit the imaging windows 46, 26, the light sources 90, and the air blowing device 92.

Since the embodiments described above only have a function for observing the behavior of resin supplied between the substrate 10 and the workpiece 30 in real time, it is not possible to carry out detailed analysis and study based on the taken images at a later time. A conceivable construction for carrying out such analysis is an observing apparatus 100 for observing an assembled state of components that further includes an image processor that carries out image processing on the image data taken by the camera 60.

The image processor can be realized by an image processing program that is installed in advance in the storage unit 80 and a CPU of a separate personal computer that can also be used as the heater operation unit 28 and/or the head operation unit 48. The image data processed by the image processor can also be favorably displayed on the display apparatus 70 in a manner where information relating to the voids, such as the positions and sizes of the voids, is visualized. It is possible to use well-known image processing software as the image processing program.

The storage unit 80 does not need to be directly provided in the observing apparatus 100 for observing an assembled state of components. More specifically, it is possible to use a storage unit provided in a personal computer.

In addition, it should be obvious that it is possible to use a construction where defective/non-defective determination data for determining whether an assembled product is defective or non-defective based on the processing state (i.e., the presence/absence of voids) for the substrate 10 and the workpiece 30 is stored in advance in the storage unit 80. With this construction, a CPU as a data comparator compares the defective/non-defective determination data with data relating to voids produced by the image processor carrying out image processing on the image data. When a condition (i.e., a product specification) in the defective/non-defective determination data is not satisfied, the operator of the observing apparatus 100 for observing an assembled state of components is warned via the display apparatus 70 and/or by audio guidance provided by an alarm.

It should be obvious that although apparatuses for observing an assembled state of components according to the present invention have been described in detail by way of the above embodiments, the present invention is not limited to the embodiments given above and may be subjected to a variety of modifications without departing from the scope of the invention.

For example, although constructions where an observing apparatus 100 for observing an assembled state of components is provided with the display apparatus 70 and the storage unit 80 are described in the first to fourth embodiments, the display apparatus 70 and the storage unit 80 do not necessarily have to be provided in the observing apparatus 100 for observing an assembled state of components and it is possible to use a construction where a separate display apparatus 70 and storage unit 80 are used. It is also possible to use a construction where the camera 60 is incorporated in the pressing head 42 and/or a construction where the camera 60 is incorporated in the stage 20.

Also, although the method of observing the assembled state of components has been described for the case where a semiconductor chip that is the observation workpiece 30 is mounted on the substrate 10 after the resin 50 has been applied on the substrate 10 set on the stage 20, it should be obvious that the method can also be applied to a case where the resin 50 is applied onto the substrate 10 in advance.

In addition, it is possible to apply the present invention to a case where the image data taken by the camera 60 is processed by the image processor and information relating to the voids at the observed part, such as the positions and sizes of the voids, is displayed on the display apparatus 70 so that the voids are distinguishable from other parts.

With the method of observing described above, it is possible to observe while the component assembling process is being carried out, but if the image data taken by the camera 60 is stored in the storage unit 80, it will be possible to observe the resin while the assembly process is being carried out and also to analyze information relating to the voids in more detail by having the image processor process the image data after the assembly process has ended.

What is claimed is:

1. An apparatus for observing an assembled state of components, comprising:
    a stage on which a substrate is set;
    a head mechanism that bonds, by applying heat and pressure, an observation workpiece made of a transparent material to the substrate via resin supplied between the substrate and the observation workpiece;
    a light source that irradiates an observed part of the substrate and the observation workpiece mounted on the stage with light; and
    a camera that takes, from the observation workpiece side, an image of the observed part when the observation workpiece is bonded to the substrate set on the stage.

2. An apparatus for observing an assembled state of components according to claim 1, wherein the head mechanism is provided with a head part that applies pressure to the observation workpiece and an imaging window for taking an image of the observed part is provided in the head part on an optical axis of the camera.

3. An apparatus for observing an assembled state of components according to claim 1, wherein the head mechanism is provided with a head part that applies pressure to the observation workpiece and the camera is incorporated in the head part.

4. A method of observing an assembled state of components for observing a bonded state when bonding an observation workpiece to a substrate using resin, at least one of the substrate and the observation workpiece being transparent, the method comprising:

a step of setting a substrate on a stage;

a step of irradiating, when the observation workpiece has been supplied onto the substrate using a head mechanism and heat and pressure are applied to resin supplied between the substrate and the observation workpiece using the head mechanism, a part of the substrate and the observation workpiece to which the heat and pressure are applied with light from a light source; and a step of taking an image of at least part of the part to which the heat and pressure are applied using a camera while the part is being illuminated.

5. A method of observing an assembled state of components according to claim 4, wherein the resin supplied between the substrate and the observation workpiece is applied after the substrate has been set on the stage.

6. A method of observing an assembled state of components according to claim 4, wherein the resin supplied between the substrate and the observation workpiece is applied in advance to the substrate.

7. A method of observing an assembled state of components according to claim 4, wherein the image taken by the camera is displayed on a display apparatus.

* * * * *